United States Patent [19]

Stecher

[11] Patent Number: 6,057,201

[45] Date of Patent: May 2, 2000

[54] METHOD OF PRODUCING A TRANSISTOR STRUCTURE

[75] Inventor: Matthias Stecher, Villach, Austria

[73] Assignee: Siemens Aktiengesellschaft, Munich, Germany

[21] Appl. No.: 09/025,211

[22] Filed: Feb. 18, 1998

[30] Foreign Application Priority Data

Feb. 18, 1997 [DE] Germany ............................ 197 06 282

[51] Int. Cl.[7] .......................... H01L 21/28; H01L 21/768
[52] U.S. Cl. ........................ 438/301; 438/305; 438/570; 438/583; 438/620
[58] Field of Search ..................................... 438/301, 305, 438/307, 373, 374, 376, 377, 430, 433, 620, 570–583

[56] References Cited

U.S. PATENT DOCUMENTS

| | | |
|---|---|---|
| 4,140,558 | 2/1979 | Murphy et al. . |
| 4,300,279 | 11/1981 | Wieder . |
| 4,833,098 | 5/1989 | Kato . |
| 4,898,835 | 2/1990 | Cawlfield . |
| 4,960,723 | 10/1990 | Davies . |
| 5,219,770 | 6/1993 | Shirato et al. . |
| 5,416,036 | 5/1995 | Hsue . |
| 5,795,793 | 8/1998 | Kinzer . |
| 5,801,077 | 9/1998 | Chor et al. . |
| 5,923,988 | 7/1999 | Cheng et al. . |

FOREIGN PATENT DOCUMENTS 0 704 894 A2  9/1994  European Pat. Off. .

OTHER PUBLICATIONS

Wolf, "Silicon Processing for the VLSI Era—vol. III", pp. 586–592, 1995.

Wissinger et al "SPT 170—A smart power technology combining robust high–voltage devices with precision analague performance," Proceedings of the 1995 International Symposium on Power Semeconductor Devices and IC's Yokohama pp. 54–57, 1995.

Preussger et al "SPT—A new smart power technology with a fully self alighned DMOS cell," IEEE, pp. 195–198, 1991.

*Primary Examiner*—John F. Niebling
*Assistant Examiner*—Jonathan Hack
*Attorney, Agent, or Firm*—Herbert L. Lerner; Laurence A. Greenberg; Werner H. Stemer

[57] ABSTRACT

The method produces transistor structures with a smaller contact opening, without having to take multiple adjustment allowances into account. Moreover, the method provides two zones of a second conductivity type, which have different dopant concentrations, so that a more gentle transition in the drain doping is obtained. The gentler transition in drain doping effects a lowering in the peak field intensity that can release hot electrons. Thus a degradation of the first insulating layer (gate oxide) caused by hot electrons is prevented.

12 Claims, 2 Drawing Sheets

METHOD OF PRODUCING A TRANSISTOR STRUCTURE

BACKGROUND OF THE INVENTION

1. Field of the Invention

The present invention relates to a method of producing a transistor structure, especially an MOS transistor structure, and to a transistor structure made by the process.

The invention takes as its point of departure methods for creating a low-impedance contact between a metallizing layer and a semiconductor material of a first conductivity type, over whose semiconductor surface an insulation layer and a semiconductor layer are disposed.

2. Description of the Related Art

Such a contact structure is known from U.S. Pat. No. 4,898,835, for instance. The insulation layer and the semiconductor layer are formed by the gate oxide and the gate of an MOS power transistor.

The European patent disclosure EP 0 704 894 A2 also discloses a method of producing a low-impedance contact between a metallizing layer and a semiconductor material. The process in EP 0 704 894 A2 which creates a self-adjusted contact hole has the advantage of producing a smaller contact opening, without having to take multiple adjustment allowances into account. Because of the smaller area of the contact region, there is a lower turn-on resistance, so that the power loss or switching loss to be dissipated makes a reduced cooling expense possible. The reference essentially relates to DMOS transistors, although other types of transistors, such as an NMOS transistor, are also mentioned.

In some types of transistor, degradation of the gate oxide can occur, caused by "hot" electrons. In the operation of such transistors, a field intensity peak can occur at the channel edge on the drain side, and this can accelerate the channel electrons to near their limit speed. Some of these "hot" electrons can thereby overcome the potential barrier at the boundary between silicon and silicon oxide, where they are trapped by positive traps located near the boundary face. A second effect of "hot" electrons is that they break open silicon-hydrogen bonds and can thus create boundary face states. In an n-channel transistor, this leads above all to degradation of the drain current, because both the number and the mobility of the channel electrons are reduced by these effects.

LDD doping (LDD stands for lightly doped drain) is currently widely used as an effective provision to counteract such oxide degradation. However, the creation of an LDD dopant profile, like the creation of a self-adjusted contact, requires the use of a spacer technique. The problem then arises that creating an LDD dopant profile and creating a self-adjusted contact make different demands of the spacers to be used. Furthermore, the two spacer processes must be integrated into the overall process control at different sequence positions.

SUMMARY OF THE INVENTION

It is accordingly an object of the invention to provide a production method for a transistor structure and a resultant transistor structure, which overcomes the above-mentioned disadvantages of the prior-art devices and methods of this general type and which, while keeping with small contact openings, prevents oxide degradation caused by "hot" electrons.

With the foregoing and other objects in view there is provided, in accordance with the invention, a method of producing a transistor, in particular a MOS transistor, which comprises the following steps:

providing a semiconductor material with a semiconductor region of a first conductivity type, and forming a first insulation layer on the semiconductor region of the first conductivity type;

forming a conductive layer on the first insulation layer, and forming a second insulation layer on the conductive layer; structuring the conductive layer and the second insulation layer by anisotropic etching;

implanting a dopant of a second conductivity type and driving the dopant into the semiconductor region of the first conductivity type, and forming a first zone of a second conductivity type in the semiconductor region of the first conductivity type;

implanting and driving in a further dopant of the second conductivity type, and forming a second zone of the second conductivity type having a higher concentration of dopant as compared with the first zone;

forming a third insulation layer and anisotropically etching the third insulation layer back to a level of the semiconductor material such that at least one insulation region remains on the semiconductor material; and forming a metallizing layer.

In accordance with an added feature of the invention, the third insulation layer is etched anisotropically with an adjusted photoresist mask.

In accordance with an additional feature of the invention, the third insulation layer is etched at least partially, and preferably completely, in self-adjusted fashion.

In accordance with another feature of the invention, prior to placing the metallization, the semiconductor material is anisotropically etched in self-adjusted fashion, using the insulation region as a mask, down into the semiconductor region of the first conductivity type, and a dopant of the first conductivity type is introduced at high concentration into the semiconductor region of the first conductivity type.

In accordance with a further feature of the invention, a further insulation layer is formed in addition to the second insulation layer, and the two insulation layers are structured substantially identically.

In accordance with yet an added feature of the invention, the first insulation layer is thinned prior to doping.

In accordance with yet an additional feature of the invention, the method comprises adjusting a thickness of the third insulation layer to substantially correspond to a thickness of the second insulation layer. The third insulation layer may have essentially the same thickness as the second insulation layer and the further insulation layer together.

Furthermore, the third insulation layer may be densified prior to structuring.

In accordance with yet a further feature of the invention, a dopant used to form the second zone of the second conductivity type corresponds to a dopant used to form the first zone of the second conductivity type, and it is preferably arsenic. In an alternative process sequence, a different dopant is used to form the second zone of the second conductivity type than to form the first zone of the second conductivity type.

If two different dopants of the second conductivity type are used, then these dopants can be driven in simultaneously by diffusion. The two zones of different dopant concentrations then result from the different diffusion speed of the individual dopants.

With the above and other objects in view there is also provided, in accordance with the invention, a transistor structure, in particular a MOS transistor, comprising:

a semiconductor material with a semiconductor region of a first conductivity type and first zones of a second conductivity type;

a first insulation layer disposed on a surface of the semiconductor region between the first zones, and a semiconductor layer disposed on the first insulation layer;

a second insulation layer disposed on the semiconductor layer;

at least one insulation region disposed on the semiconductor material laterally adjacent the semiconductor layer; and second zones of a second conductivity type disposed on a surface of the semiconductor material adjacent the first zones, the second zones having a greater conductivity than the first zones.

In accordance with again an added feature of the invention, the first zones in the semiconductor material surround the second zones completely. The insulation region and the second insulation layer may be formed of mutually different materials.

In accordance with again another feature of the invention, a further insulation layer is disposed on the second insulation layer.

In accordance with again an additional feature of the invention, the insulation region and the further insulation layer are formed of mutually different materials.

In accordance with a concomitant feature of the invention, the semiconductor material in the first and second zones is etched anisotropically and self-adjusting, with the insulation region acting as a mask, down into the semiconductor region of the first conductivity type, and the semiconductor region has a dopant of the first conductivity type introduced therein at a relatively high concentration.

The primary advantage of the invention is that because of the two zones of a second conductivity type, which have different dopant concentrations, a more gentle transition in the drain doping is obtained. This gentler transition in drain doping effects a lowering in the peak field intensity that can release "hot" electrons. Thus a degradation of the first insulation layer (gate oxide) caused by "hot electrons" is prevented.

The invention also has the advantage that the degradation of the first insulation layer can be markedly reduced, without interfering of the creation of self-adjusted contact holes. Even if the transistor structure itself has no self-adjusted contact hole but instead self-adjusted contact holes are provided only in other components on the chip, for instance in DMOS transistors.

However, it is preferable for the transistor structure of the invention itself to have a self-adjusted contact hole, because this allows better utilization of the limited total chip surface area. Because of the self-adjustment of the contacts, a smaller contact opening is produced without having to take multiple adjustment allowances into account. Because of the smaller area of the contact region, there is a lower turn-on resistance, so that the power loss or switching loss to be dissipated reduces the cooling expense considerably. Moreover, the invention makes it possible to reduce parasitic effects, so that even in critical cases it is possible to control the switching properties by way of the structured semiconductor layer or the gate. The reduced resistance between the contact region and the channel zone makes the breakdown behavior of the configuration more stable.

Preferably, before the application of the metallizing layer, the semiconductor material is etched anisotropically in self-adjusted fashion, using the insulation region as a mask, down into the semiconductor region of the first conductivity type, and a dopant of the first conductivity type is implanted at high concentration into the semiconductor region. As a result, a simultaneous low-impedance, space-saving contact with the zone of the second conductivity type and the semiconductor region of the first conductivity type becomes possible.

Finally, as noted above, the first zones in the semiconductor material surround the second zones entirely.

Other features which are considered as characteristic for the invention are set forth in the appended claims.

Although the invention is illustrated and described herein as embodied in a method of producing a transistor structure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
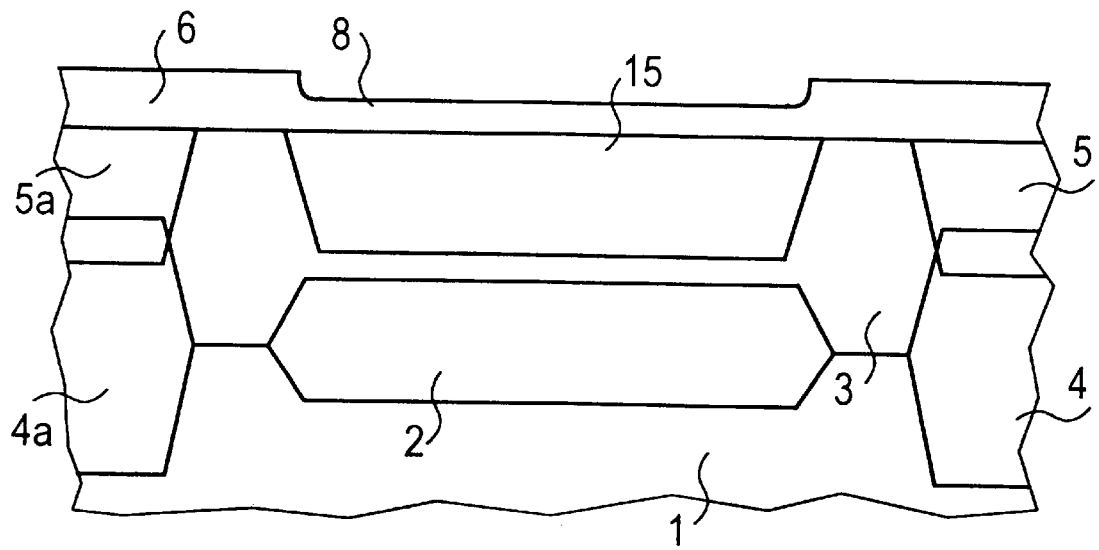
FIGS. 1–4 are schematic elevational-sectional views illustrating various steps in the production method of the invention.

Referring now to the figures of the drawing in detail and first, particularly, to FIG. 1 thereof, which shows the basic structure on which the invention is based, there is seen a semiconductor substrate 1 with boron doping and arbitrary orientation. An n-doped well 3 is disposed on or in the substrate 1, for instance epitaxially. The well 3 is contacted with low impedance by means of a zone 2 of high conductivity. The well 3 is insulated with p-doped regions 4a and 4b and 5a and 5b, each having high conductivity. In the n-doped well 3, a semiconductor region 15 of a first conductivity type, that is, a p-doped well 15, is formed. The p-doped well 15 is formed by first structuring an insulation layer 6, for instance of silicon oxide, that covers the surface of the configuration, and subsequently, for instance by means of furnace coating, a p-doped layer of medium conductivity is created in the n-doped well 3 and subsequently driven in. This creates a thermally created oxide 8 on the structured surface.

Figure 2:
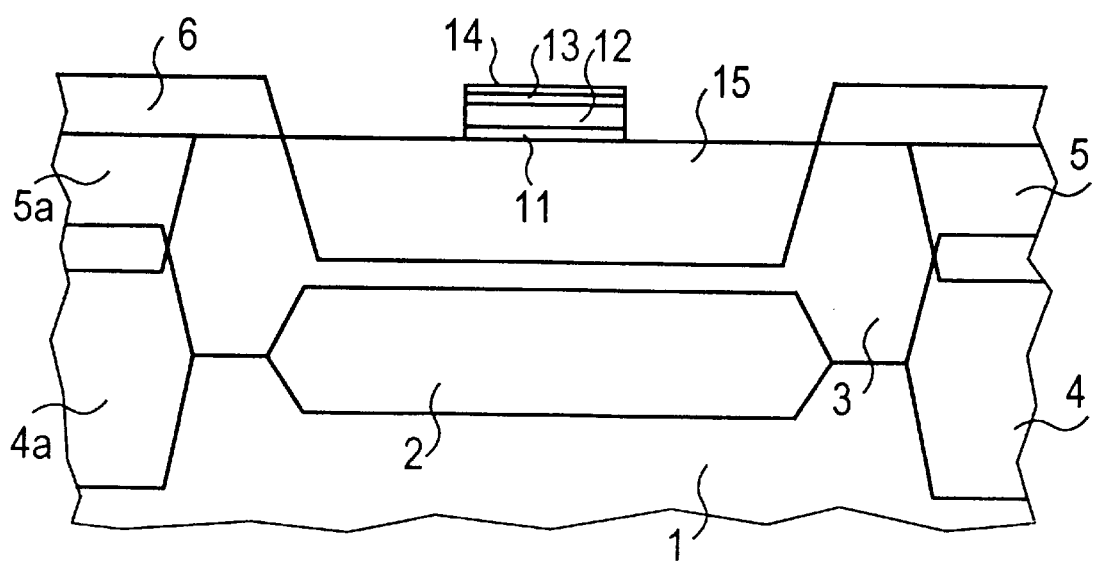

With FIG. 1 as the point of departure, the active component regions are created in the following. Referring now to FIG. 2, first the oxide layer 8 and the oxide layer 6 is structured with a standard photographic technique and wet chemical etching; the oxide angle can be adjusted with a low-dosage preimplantation. This preimplantation may for instance be a full-surface argon implantation. This is followed by conventional process steps. In CMOS transistors, the threshold voltage of the transistors can be adjusted by means of a suitable low-dosage doping.

With the next step, a first insulation layer 11 is created, for instance in the form of thermally created silicon oxide. In MOS transistors, this layer performs the function of a gate insulation. After that, a conductive layer 12 is applied, for instance a polysilicon layer. The layer 12 is doped to high conductivity by means of furnace coating. From this layer, the gate of an MOS transistor, a resistor, or a conductor track is created.

In the next step, a second insulation layer 13, preferably a thermal silicon oxide layer, is formed on the semiconductor layer. A further insulation layer 14 is then created over the second insulation layer 13, preferably a TEOS layer. The double layer 13, 14 comprising the thermal oxide 13 and the TEOS oxide 14 is then structured and anisotropically etched using a standard photo technique.

Using the double layer 13, 14 as a mask, the semiconductor layer 12 is then etched anisotropically. An ensuing thinning of the exposed insulation layer 11 to stray oxide thickness is also possible, by means of an anisotropic or isotropic etching. The resultant configuration is shown in FIG. 2.

Figure 3:
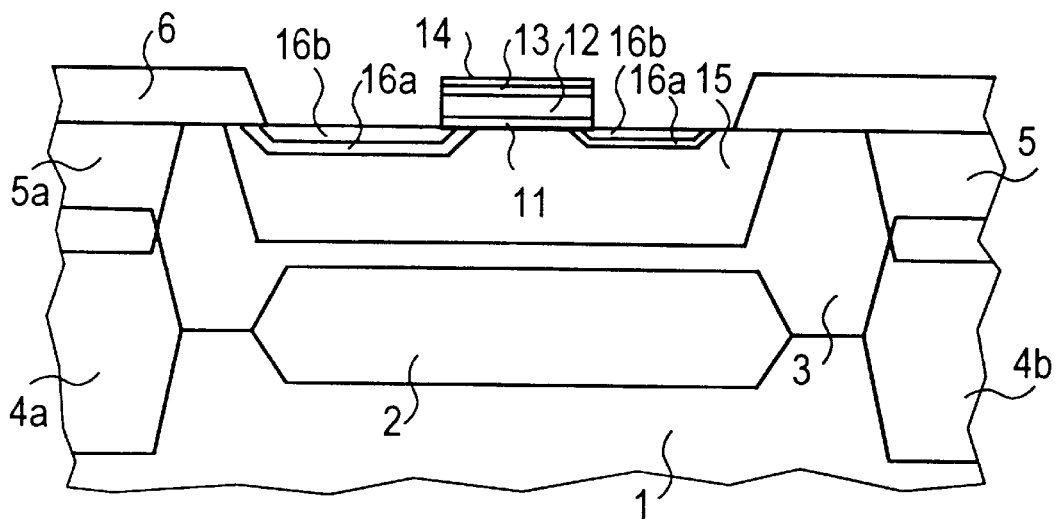

By means of a standard resist photo technique, first $n^-$-doped zones 16a of low conductivity are implanted in the semiconductor material 3 and driven in. Arsenic is preferably used as an electron donor. After that, second $n^+$-doped zones 16b of high conductivity are implanted and driven into the semiconductor material 3; see FIG. 3. Once again, arsenic is preferably used as an electron donor. The n-doped zones 16a, 16b form the source/drain regions of the NMOS transistors. The zone 16a of low conductivity is formed such that part of the zone 16a is located under the polysilicon layer 12; that is, a reliable overlap of the gate electrode over part of the zone 16a is assured. The zone 16a surrounds the zone 16b in the semiconductor substrate 3 (p-doped well 3), thus producing a gentler transition in the drain doping. This gentler transition in the drain doping lowers the field intensity peak that can develop at the drain zone. Accordingly, degradation of the first insulation layer 11 (gate oxide) caused by "hot" electrons is safely prevented.

Following the driving in of the n-doped zones 16a and 16b, a third insulation layer 17 is applied. The third insulation layer is preferably an oxide that contains either phosphorus or boron, and it has a thickness similar to that of the first insulation layer, or to the sum of the sandwich layers 13 and 14. Next, the layer 17 can be densified in a furnace process, in which the layer should not flow markedly.

In the next process step, the third insulation layer is structured. This is effected with a further phototechnique and anisotropic etching down to the semiconductor surface. This means that the etching step stops at the surface of the semiconductor substrate 3 (p-doped well 3). The phototechnique is chosen such that only the insulation layer 17 above the zone 16b disposed to the left of the semiconductor layer 12 is etched.

The etching of the insulation layer 17 can be performed such that the photomask used for the etching is adjusted to the contact hole that is to be created. However, that has the disadvantage that because of adjustment errors, a larger contact hole region has to be provided.

The etching of the insulation layer 17 is therefore preferably performed at least partially in self-adjusted fashion. As a result, very small contact hole regions can be realized.

The etching forms the insulation regions 18 on the semiconductor region 15. The insulation regions 18 assure good electrical insulation of the semiconductor layer 12 from the metallization 19 that is to be formed later. Moreover, the insulation region 18 comprising boron phosphorus silicate prevents the penetration of contaminants, in the form of sodium ions, out of the metallization 19 (to be formed later) into the semiconductor layer 12. If the etching of the insulation layer 17 has been done in self-adjusted fashion, then the insulation region 18 is a spacer.

Using the thus-created structure of the layer 17 as a mask in the region of the contact that is to be made, the semiconductor material is then etched on the left-hand side of the gate. The resultant trench, because of the insulation region 18 formed by the layer 17, has a fixed spacing from the structured semiconductor layer 12, or in other words from the polysilicon edge.

After that, a high-dosage p-dopant 25 is implanted as a third conductive material into the semiconductor material, that is, into the bottom of the silicon trench that has been formed. The function of this step is to reduce the contact resistances. Here, again, the mask is provided by the second insulation layer 17.

In the next process step, the third insulation layer is further structured photographically and with anisotropic etching down to the semiconductor surface. Once again, this means that etching stops at the semiconductor surface. The phototechnique is selected such that only the insulation layer 17 above the zone 16b disposed on the right-hand side of the semiconductor layer 12 is etched. Once again, this creates an insulation region 18 above the semiconductor substrate 1. This insulation region 18 also assures good electrical insulation of the semiconductor layer 12 from the metallization 19 that is to be formed later. Moreover, the insulation region 18 comprising boron phosphorus silicate prevents the penetration of contaminants, in the form of sodium ions, out of the metallization 19 to be formed later into the semiconductor layer 12.

Figure 4:
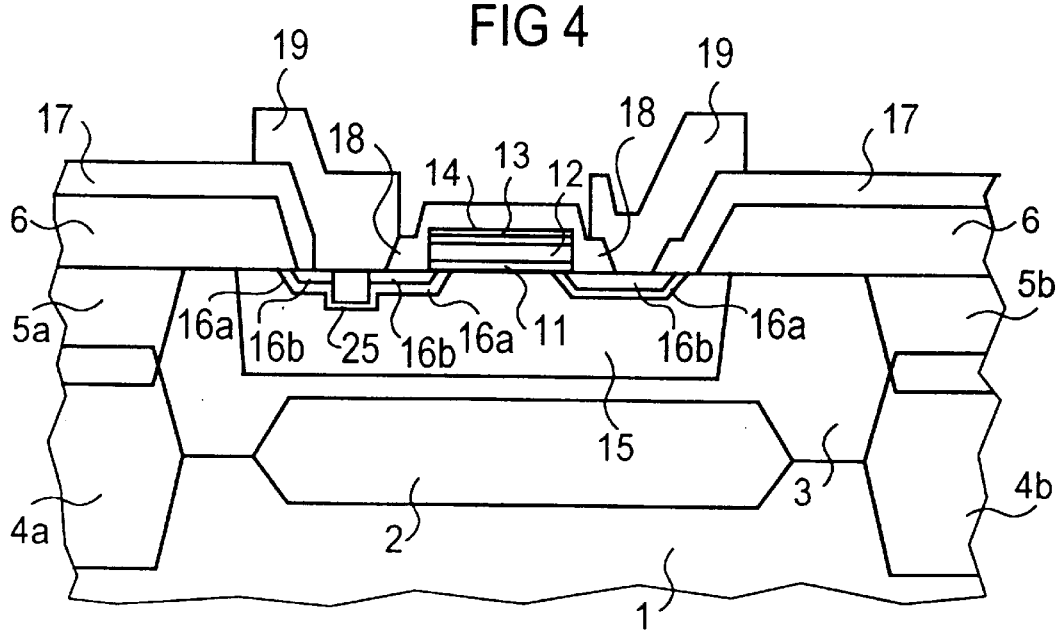

In the next step illustrated in FIG. 4, a metallizing layer 19, for instance of aluminum, is applied over the entire surface. The function of this layer is to contact the semiconductor material or to form a conductor track.

The following process steps in the production of semiconductor structures are conventional and known from from the prior art. After the metallizing layer 19 has been applied it is structured; an insulation layer, typically TEOS, is deposited, planarized and structured. This is followed by the application and structuring of a second conductive layer, forming contacts between the first and second conductive layers. After that, a further insulation layer can be deposited and structured. Still a further insulation layer, typically an oxide that contains phosphorus, is applied, over which a silicon nitride layer is provided as a passivation layer.

The method described in conjunction with FIGS. 1–4 is suitable for producing integrated circuits with various types of components. In accordance with the novel invention, high-depletion p-channel transistors, resistors, capacitors, and diodes can also be made. All the components are insulated from one another by p-n junctions.

I claim:

1. A method of producing a transistor which comprises the following steps:

a) providing a semiconductor material with a semiconductor region of a first conductivity type, and forming a first insulation layer on the semiconductor region of the first conductivity type;

b) forming a conductive layer on the first insulation layer, and forming a second insulation layer on the conductive layer;

c) structuring the conductive layer and the second insulation layer by anisotropic etching;

d) implanting a dopant of a second conductivity type and driving the dopant into the semiconductor region of the first conductivity type, and forming a first zone of a second conductivity type in the semiconductor region of the first conductivity type;

e) implanting and driving in a further dopant of the second conductivity type, and forming a second zone of the second conductivity type having a higher concentration of dopant as compared with the first zone;

f) forming a third insulation layer and anisotropically etching the third insulation layer back to a level of the semiconductor material such that at least one insulation region remains on the semiconductor material;

g) anisotropically etching the semiconductor material in self-adjusted fashion, using the insulation region as a mask, down into the semiconductor region of the first conductivity type;

h) introducing a dopant of the first conductivity type at high concentration into the semiconductor region of the first conductivity type; and i) forming a metallizing layer.

2. The method according to claim 1, wherein step f) comprises etching the third insulation layer anisotropically with an adjusted photoresist mask.

3. The method according to claim 1, wherein step f) comprises etching the third insulation layer at least partially in self-adjusted fashion.

4. The method according to claim 1, wherein step f) comprises etching the third insulation layer completely in self-adjusted fashion.

5. The method according to claim 1, which comprises forming a further insulation layer in addition to the second insulation layer, and structuring the two insulation layers substantially identically.

6. The method according to claim 1, which further comprises, prior to step d), thinning the first insulation layer.

7. The method according to claim 1, which comprises adjusting a thickness of the third insulation layer to substantially correspond to a thickness of the second insulation layer.

8. The method according to claim 1, which further comprises densifying the third insulation layer prior to structuring.

9. The method according to claim 1, wherein a dopant used to form the second zone of the second conductivity type corresponds to a dopant used to form the first zone of the second conductivity type.

10. The method according to claim 9, wherein the dopant used to form the first and second zones is arsenic.

11. The method according to claim 1, wherein a dopant used to form the second zone of the second conductivity type is different from a dopant used to form the first zone of the second conductivity type.

12. The method according to claim 11, wherein the steps of driving in the dopant of the second conductivity type are performed simultaneously.

* * * * *